United States Patent [19]

Devereux et al.

[11] Patent Number: 4,876,659
[45] Date of Patent: Oct. 24, 1989

[54] PSEUDO-RANDOM CODE GENERATOR FOR USE WITH A GLOBAL POSITIONING SYSTEM

[75] Inventors: William S. Devereux, Glenwood; Edwin E. Westerfield, Silver Spring, both of Md.

[73] Assignee: The Johns Hopkins University, Baltimore, Md.

[21] Appl. No.: 188,822

[22] Filed: May 2, 1988

[51] Int. Cl.[4] .............................................. G06F 7/00
[52] U.S. Cl. ....................................... 364/717; 331/78
[58] Field of Search ........................... 364/717; 331/78

[56] References Cited

U.S. PATENT DOCUMENTS

| | | | |
|---|---|---|---|
| 4,047,008 | 9/1977 | Perkins | 364/717 |
| 4,142,240 | 2/1979 | Ward et al. | 364/717 |
| 4,748,576 | 5/1988 | Beker et al. | 364/717 |

OTHER PUBLICATIONS

Mitchell et al., "Table-Lookup Methods for Generating Arbitrary Random Numbers", *IEEE Trans. on Computers*, vol. C-26, No. 10, Oct. 1977, pp. 1006-1008.

*Primary Examiner*—David H. Malzahn
*Attorney, Agent, or Firm*—Robert E. Archibald; Howard W. Califano

[57] ABSTRACT

An apparatus for generating pseudo-random codes is disclosed. The apparatus uniquely stores a set of codes in a memory and uniquely retrieves a particular code sequence. The apparatus has particular application to Global Position Satellite (GPS) earth receivers.

1 Claim, 2 Drawing Sheets

PSEUDO-RANDOM CODE GENERATOR FOR USE WITH A GLOBAL POSITIONING SYSTEM

STATEMENT OF GOVERNMENTAL INTEREST

The Government has rights in this invention pursuant to Contract No. N00024-85-C-5301 awarded by the Department of the Navy.

BACKGROUND AND/OR ENVIRONMENT OF THE INVENTION

1. Field of the Invention

The present invention is an apparatus for economically generating pseudo-random codes. The present invention has particular utility in generating codes of the Gold code type for use as the Clear/Acquisition (C/A) code in the GPS (Global Positioning System) earth receivers.

2. Description of the Contemporary and/or Prior Art

Prior art implementations to generate the C/A codes for GPS receivers require complex circuitry that increase the cost of the receiver. In prior art, the code is generated by implementing two maximal length shift registers, in standard digital logic. Additional logic is required to implement the code select involving "exclusive or" logic. Most prior art implementations require ten or more logic chips to provide a code generator.

As background, the Air Force initiated development of the GPS (Global Positioning System) a number of years ago. This system allows a user, equipped with the proper equipment, to accurately determine his position anywhere in the world at any time. The system makes use of 18 satellites in orbit at a height of 10,900 miles above the surface of the earth. Each satellite continuously transmits signals at frequencies of 1575.42 MHz, known as L1 and 1227.6 MHz, known as L2. The L1 frequency is phase modulated by two independent modulations. These are known as the C/A (Clear/Acquisition) signal and the P (Precision) signal. The two signals are phase modulated on the carrier in an orthogonal manner, i.e., at 90 degrees to each other. The L2 transmission consists of a carrier bi-phase modulated by only the P code.

The C/A signal is generated by bi-phase modulating the carrier with a pseudo-random code that has a chip (bit) rate of 1.023 MHz, a length of 1023 bits and repeats every millisecond. The code is of a form known as a Gold code. This code is generated by exclusive oring two 10-bit maximal length shift registers that have certain properties. There are a total of 36 different codes formed by combining various phases of the two codes. Each satellite within the constellation is assigned a different code.

The P signal is generated by bi-phase modulating the carrier with a pseudo-random code that has a chip rate of 10.23 MHz and a length of about 270 days. The code is reset every week. A different phase (week) of the code is used for each satellite. This code with not be described further in this document.

A system user must be equipped with a receiver that can receive the transmissions from the satellites. Typically signals from a minimum of four satellites must be tracked to determine the user's position. All satellites transmit the C/A codes essentially in synchronization, i.e., all satellites will be transmitting the code epochs at the same time. By the user noting the difference in time of receipt of the epochs from the four satellites, the range differences from the user to each satellite can be determined. The satellites also transmit a digital data stream that contains information that allows the positions of the satellites as a function of time to be determined. By combining this information with the range difference information the position of the user can be determined.

To track the transmissions from the satellite the user must generate a relica of the code sequence generated by the satellite. The replica is used to effectively cancel out the code imparted on the signal, by the satellite, leaving only a carrier which can be tracked using conventional techniques. The phase of the replica is shifted till it is precisely aligned with the code on the received signal. The timing of this shifted code with respect to local time is then indicative of the range between the satellite and the receiver.

Again, in a typical prior art receiver, the code is generated by implementing the two maximal length shift registers in standard digital logic. Additional logic is required to implement the code select and "exclusive or" logic. Most implementations will require ten or more logic chips to implement the code generator.

SUMMARY OF THE INVENTION

The present invention provides a unique apparatus for storing and retrieving a set of pseudo-random codes. When utilized with a GPS receiver, the invention results in a significant reduction in the number of chips required to generate the C/A code, then reducing size, weight, power and cost of GPS receivers. Thirty two or more codes can be written into a Read Only Memory (ROM). Selected address lines are used to pick an appropriate block of memory within the ROM that contains the desired code. Additional address lines to the ROM are under the control of a counter, so that an 8-bit word is outputted for each clock pulse. Each of the 8-bit words contains one bit for each of eight codes. A multiplexer is used to select one of the eight codes thereby generating the selected pseudo random code. The code is generated at the clock rate with each sequential bit of the code appearing on the output line during each clock cycle.

BRIEF DESCRIPTION OF THE DRAWINGS

In order that the present invention may be more fully understood, it will now be described, by way of example, with reference to the accompanying drawings.

FIG. 2 comprising FIG. 2a shows four basic memory locations each containing 8 pseudo-random codes; FIG. 2b shows the arrangement of the pseudo-random code in a typical basic memory location.

DETAILED DESCRIPTION OF THE PREFERRED EMBODIMENT

The present invention provides an apparatus for storing and retrieving a set of pseudo-random codes. Although the invention has general applicability it will be described in the context of generating C/A codes for GPS receivers.

Figure 1:
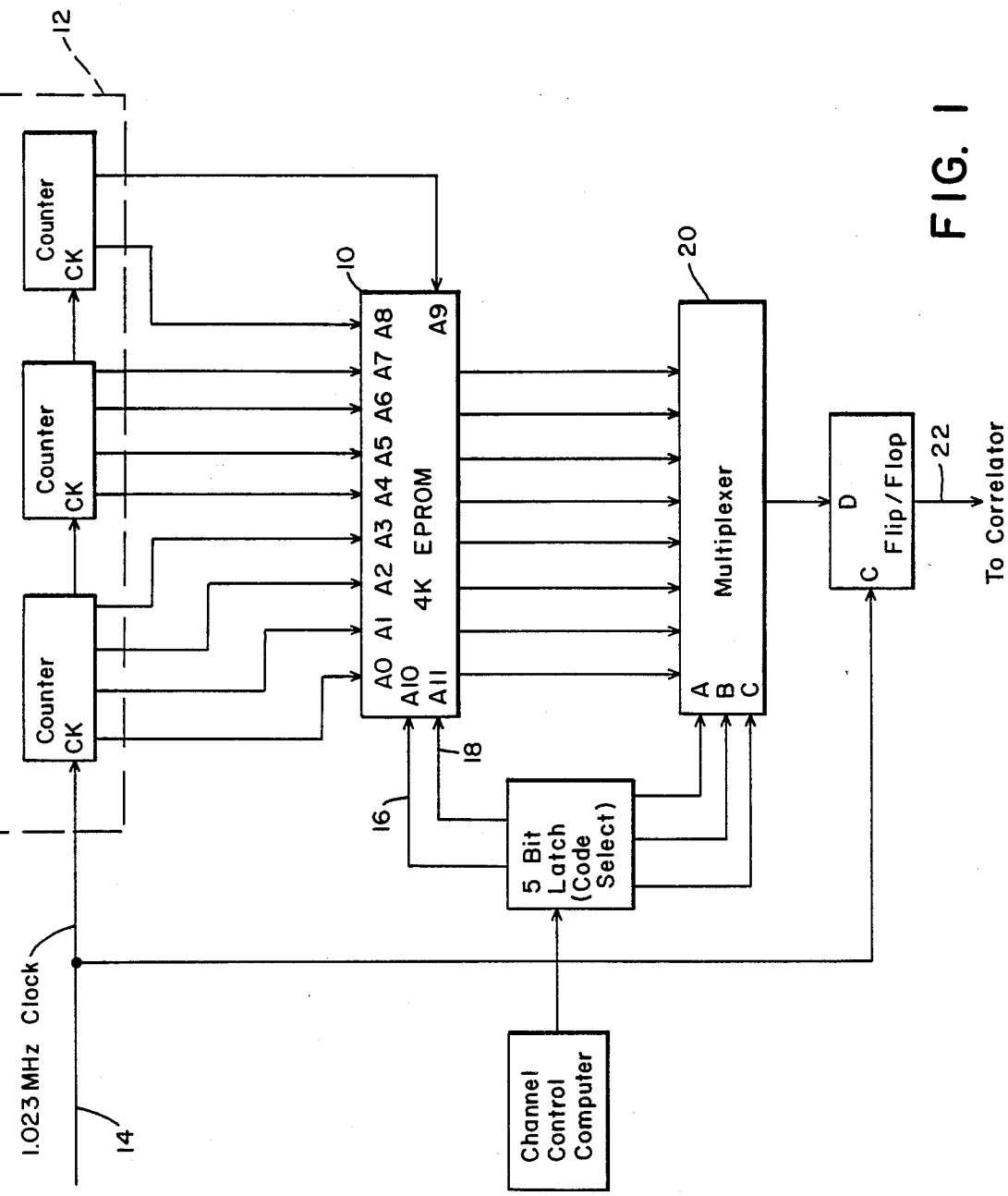
FIG. 1 is a simplified block diagram of the pseudo-random code generator as taught by the present invention.

FIG. 1 is a simplified block diagram of the code generator for the GPS receiver. Thirty two of the thirty six C/A codes are written into EPROM (10). (The four codes not included are used only for special ground transmitters and not for transmissions from satellites, and are therefore not needed.) Address lines $A_0$–$A_9$ of EPROM (10) are under control of a counter (12) that is clocked by a 1.023 MHz clock signal (14). For convenience in the current design the counter counts down. It is initially loaded with a count of 1022 and counts down to zero. When it reaches zero it reloads the count of 1022 and continues the process. To provide the correct output, the code is loaded into the EPROM in reverse order, i.e., address zero contains the last bits of the sequence.

The desired code is generated by first selecting the desired block of codes in the EPROM, by appropriately setting the two high order EPROM address lines (16, 18), and then by selecting one bit within the byte output for each counter state. This latter selection is made with a multiplexer chip (20) whose inputs are connected to the EPROM output and whose select lines are connected to a five-bit latch that holds the code selection. The output of the multiplexer is fed to a latch where the signal is reclocked and then provided to the correlator (22) of the GPS receiver.

Figure 2B:
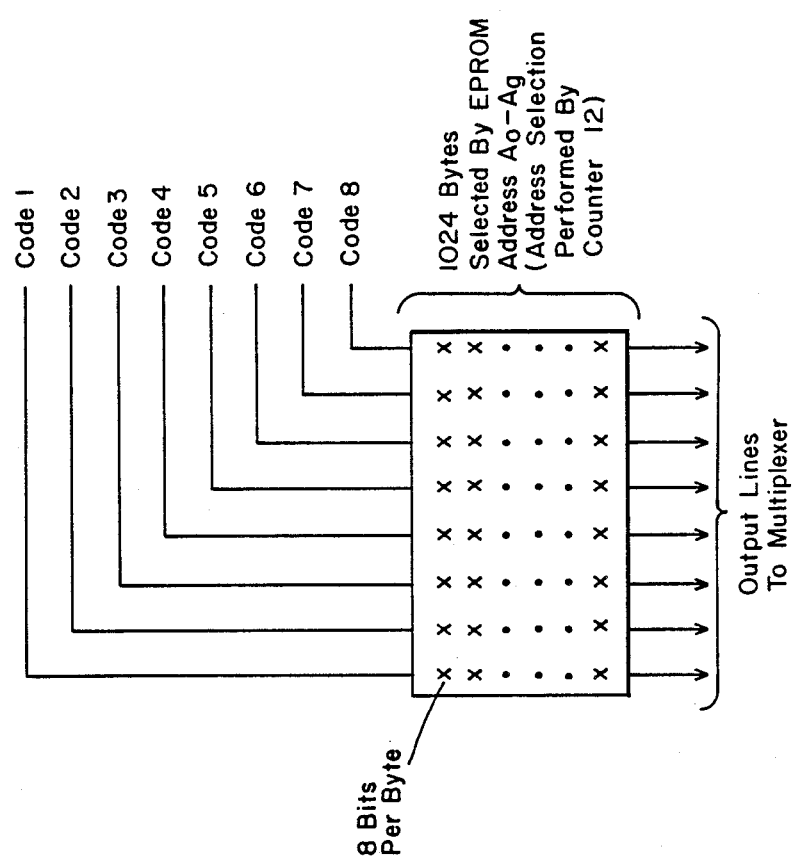
FIGS. 2a and 2b is a block diagram showing the storage location of the pseudo-random codes in memory.
Figure 2A:
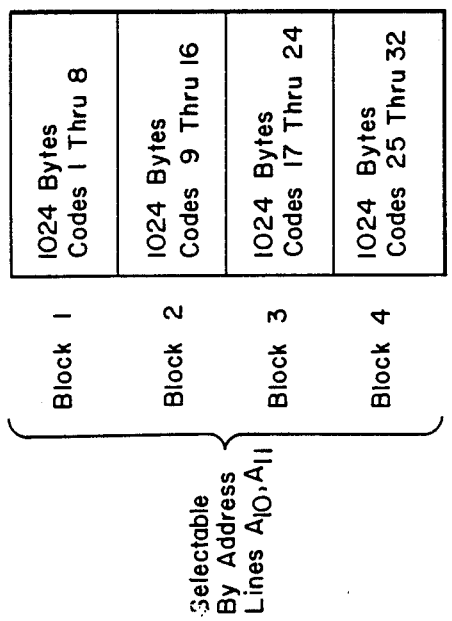

FIG. 2 illustrates the manner in which the 32 C/A codes are stored in EPROM (10). The EPROM chip shown in the preferred embodiment (FIG. 1) is a 4096 byte memory chip. As shown in FIG. 2a the memory is broken into four 1024 byte blocks, with each block containing eight codes. Address lines $A_{10}$ and $A_{11}$ are used to select the appropriate memory block. As shown in FIG. 2b, in each memory block the eight codes are stacked so that each byte contains a bit from each of the eight codes. Address lines $A_0$–$A_9$ are controlled by counter 12 and cause a byte word to exit from the EPROM with each clock pulse. Each byte contains a code bit for each of the C/A codes stored in that particular memory block. The 8-bit output from the EPROM passes to a multiplexer (20) where the bit associated with the desired code is selected.

Therefore, the desired code, of the 32 C/A codes provided in our example, is generated first by selection of the desired block of codes in the EPROM, by appropriately setting the two high order EPROM address lines ($A_{10}$ and $A_{11}$) and then by selecting one bit within the byte output for each counter state. In this manner a bit from the selected C/A code is sent down line 22 during each clock cycle and a repeating selectable C/A code is generated. In a GPS receiver the select code is stored in a 5-bit latch under control of a channel control computer. The 5-bit latch stores commands for the $A_{10}$ and $A_{11}$ address lines and the multiplexer control lines.

Although the invention has been described in terms of its important application as a GPS receiver C/A code generator, its potential uses are much broader. The invention can have any number of codes in a code set depending on the size of the ROM memory. The speed of code generation is limited only by the clock rate. It will also be understood that various changes in the details, materials, arrangements of parts and operational conditions which have been herein described and illustrated in order to explain the nature of the invention, may be made by those skilled in the art within the principles and scope of the present invention.

Having thus set forth the nature of the invention, what is claimed is:

1. An apparatus for generating a pseudo-random code, comprising:

a memory means for storing a set of pseudo-random codes, wherein the memory is allocated into a plurality of memory spaces each one word wide, with each bit in the word containing a bit for a different pseudo-random code, and wherein the length of the memory space is dependent on the length of the pseudo-random codes;

a first address means for selecting the memory space containing the desired pseudo-random code;

a counter operably coupled to a clock;

a second address means operably coupled to said counter to output a data word from the selected memory space of said memory with each clock cycle, where each word contains a bit associated with several possible pseudo-random codes;

a multiplexer operably coupled to said memory to select the bit associated with the selected pseudo-random code, whereby sequential bits for the selected pseudo-random code is generated with each clock cycle.

* * * * *